United States Patent
Lee et al.

[11] Patent Number: 6,138,494
[45] Date of Patent: Oct. 31, 2000

[54] ROBOT CALIBRATION TOOL AND METHOD

[75] Inventors: Chwan-Der Lee, Miao-Li; Shun-Jye Huang, Hsin-Chu, both of Taiwan

[73] Assignee: Taiwan Semiconductor Manufacturing Co., Ltd., Hsin-Chu, Taiwan

[21] Appl. No.: 09/346,740

[22] Filed: Jul. 2, 1999

[51] Int. Cl.[7] .................................................. G01J 1/02
[52] U.S. Cl. .................................................. 73/1.75
[58] Field of Search .................................. 73/1.01, 1.75, 73/1.79, 1.81; 356/243.1, 243.4; 901/3, 5, 4

[56] References Cited

U.S. PATENT DOCUMENTS 4,988,194  1/1991  Hara et al. ......................... 356/243.1
5,438,418  8/1995  Fukui et al. .
5,691,812  11/1997  Bates et al. ......................... 356/243.4

*Primary Examiner*—Robert Raevis
*Attorney, Agent, or Firm*—Bacon & Thomas, PLLC

[57] ABSTRACT

A calibration tool and method for a robot includes a circular transparent plate with at least one reference or "symbolize" line on a planar surface of the tool and a guide groove on an edge of the tool. The size of the tool is equal to the size of a wafer to be processed by the robot. A calibration method using the tool involves placement of the tool on a wafer just before the robot is used to process the wafer, and then driving the robot to catch the tool and move it between the cassette and processing chambers. Because a non-transparent wafer is replaced by the transparent plate, it is easy to adjust the motion of the robot and record information about the motion of the robot, which can then be used to control the motion of the robot.

9 Claims, 1 Drawing Sheet

ROBOT CALIBRATION TOOL AND METHOD

BACKGROUND OF THE INVENTION

1. Field of the Invention

The present invention relates to the calibration of a robot, and more particularly to a calibration tool and method that provide a standard and efficient calibration process.

2. Description of the Prior Art

In current semiconductor fabrication, different processes such as etching, doping etc. require different machines. Therefore, it is necessary to move wafers between cassette and process chambers.

Obviously, when a wafer is moved from a cassette to a machine, a robot is used to catch the wafer and move the wafer to these process chambers of the machine. It is important that the robot must hold analogous positions of different wafers in the same position. Otherwise, because processes such as photolithography and etching are sensitively dependent on the position is of chips of the wafer, the yield of the machine is decreased. Beside, the robot must catch the wafer at the optimized positions, i.e. the relative position between the wafer and the robot must situate in the predetermined working range of the robot. Otherwise, deviation of the relative position increases the risk that the wafer collides with the machine and is damaged or even broken.

Because the wafer is not transparent, it is difficult to adjust the relative position to the predetermined working range. On the other hand, because the wafer comprises a plurality of chips it is unsuited to make any label on the wafer. Thus, accuracy of the relative position between the wafer and the robot is unfavorable and the yield of the machine is decreased.

According to the previous discussion, it would be desirable to provide a robot calibration tool and a robot calibration method that may be used to provide an efficient and accurate robot calibration process.

SUMMARY OF THE INVENTION

Correspondingly, the primary object of the present invention is to propose a robot calibration tool that is useful to find out the optimized relative position between the robot and the wafer.

A further object of the present invention is to propose a robot calibration method that shortens a required time of the robot calibration process and increases precision of the robot calibration process.

Furthermore, an important object of the present invention is to propose a standard calibration process that may be carried out independent of an operator of the process.

In order to accomplish these objects of the invention, a robot calibration tool and a robot calibration method are proposed.

The provided tool is a circular transparent plate with at least one symbolize (i.e., calibration referred) line, where the size of the plate is equal to size of the wafer.

The provided method is used to calibrate the position of the robot of any machine that is used to treat the wafer, the provided method comprising the following steps:

First, a circular transparent plate, is provided where the size of the circular transparent plate is equal to the size of the wafer.

Second, the circular transparent plate is placed over a calibration position such as storage pick/drop position and cassette pick/drop position.

Third, a robot is moved to an optimized position such that a relative position between the robot and the circular transparent plate situates in a predetermined working range of the robot and such that the circular transparent plate is properly caught by the robot.

Fourth, information about the optimized position and the motion of the robot is saved.

Finally, a dry transform test is executed to insure that when the robot move the circular transparent plate to any process chamber, the circular transparent plate never collides with the machine.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

In order to explain the proposed robot calibration tool and method, the following paragraphs and correlative figures are used to illustrate the provided invention.

Figure 1A:
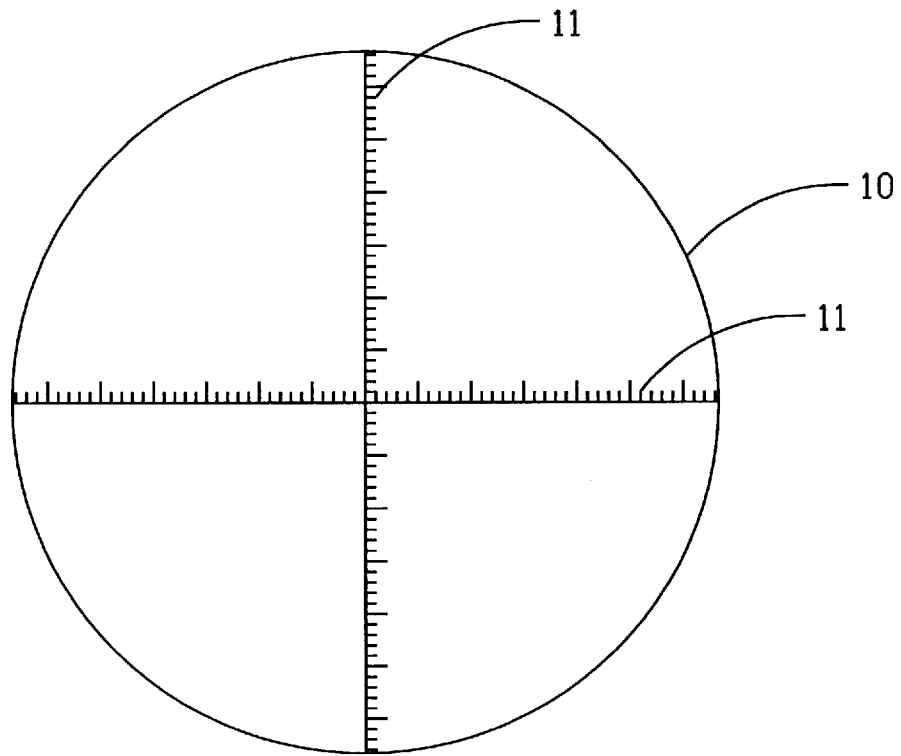
FIG. 1A illustrates the top view of the proposed robot calibration tool.
Figure 1B:
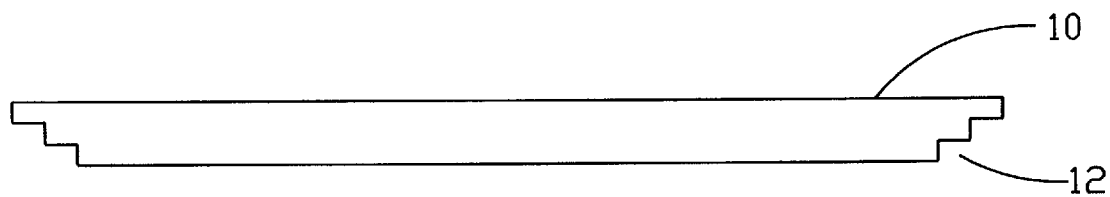
FIG. 1B illustrates the cross section of the proposed robot calibration tool.

Referring to FIG. 1A, robot calibration tool 10 is a circular transparent plate, where the size of the plate is equal to the size of the wafer. For the current standardization of semiconductor fabrication, the typical size of a robot calibration tool 10 is about 8 inches. Herein, because during the calibration process tool 10 may collide with anything such as a wall of process chamber, it is better that the material of tool 10 is elastic to decrease the risk of damage and break. Therefore, the material of robot calibration tool 10 comprises elastic material and plastic. Furthermore, because calibration tool 10 is put in any calibration position that the wafer is put in such as a cassette pick/drop position and storage pick/drop position, although the size of the cassette and storage maybe different, calibration tool 10 must be secure in any calibration position. Thus, as the indicated cross-section shown in FIG. 1B, calibration tool 10 comprises one guide groove on its edge to insure the calibration tool 10 is fixed in different a position.

Moreover, at least one symbolize line 11 is located on the robot calibration tool 10, where symbolize line 11 is used to label the position that the robot contacts with tool 10. Generally, symbolize line 11 is formed by the crisscross and the intersection of crisscrosses located at the center of tool 10.

In addition, the transparent plate must be thick enough to prevent bend and strain. The practical thickness of tool 10 depends on the size and material of tool 10. For example, when the diameter of tool 10 is 8 inches as the diameter of current semiconductor wafer, a typical thickness is about 2 mm and the depth of the guide groove is about 0.2 mm.

The robot calibration method is used to calibrate the motion of the robot of a machine. Before any wafer is treated by the machine with a robot and at least one process chamber, the method is used to calibrate the motion of the robot. The provided robot calibration method comprises the following steps:

First, a circular transparent plate is provided as robot calibration tool 10, where the size of the circular transparent plate is equal to size of the wafer and at least one symbolize line 11 is located on the top surface of the plate.

Second, the circular transparent plate is placed over a calibration position of the wafer, for example the storage pick/drop position of the machine and the cassette pick/drop position.

Third, the robot of the machine is moved to an optimized position such that the relative position between the robot and the circular transparent plate situates in a predetermined working range of the robot, and such that the circular transparent plate is properly caught by the robot. The predetermined working range means that when the relative position situates in the range, tool 10 never collides with the machine during the process that the robot moves tool 10 to the process chamber and moves tool 10 back to the storage position. Obviously, the practical predetermined working range depends on the type of the machine. For an ordinary type of robot in which two front shoes are located in a front end of the robot, the predetermined working range means that the front shoes of the robot must match the central line of tool 10.

Obviously, when the robot moves from an inner part of the machine to the calibration part, it is necessary to adjust the motion of the robot such that the robot locates in the required optimized position. Where parameters of the motion of the robot comprise a moving step, rotating angle and moving distance, for different calibration positions, the results of these parameters also are different. When the robot does not move to the optimized position, symbolize line 11 is useful to help the operator to adjust the motion of the robot. Because tool 10 is transparent and at least one symbolize line is on it, it is easy to find out the optimize position. In other words, required time to finish the robot calibration is shortened by the provided robot calibration method.

Fourth, when the robot is moved to the optimized position, saves the calibration position is saved together with the results of these parameters.

Finally, executes a dry transform test that just moves tool 10 to the process chamber and then moves out to the calibration position. The object of the dry transform test is to ensure that the circular transparent plate never collides with the machine when the robot moves the circular transparent plate to any process chamber of machine. As no collision happens, it is conclusive that the robot moves to the optimized position.

Consequently, when the robot calibration process is finished, the machine is used to process wafers. Each time a wafer is placed in the calibration position, the robot is moved to the optimized position and the motion of the robot is decided by these saved results of parameters of the robot calibration process. By the way, each time the robot can move to the optimized position without recurrent calibration process. Beside, a more important advantage of the method is that the method provides an objective process to calibrate the motion of the robot. The resulting calibration is independent on the operator on the calibration process. On The other words, the proposed method is a standard calibration method.

Consequently, it is obvious that the proposed invention is independent of the detail of the machine, and is applicable to any machine with at least one robot and at least one process chamber.

Of course, the proposed invention also is applicable to any cassette where the size and shape of the guide groove is adjustable. Beside, the proposed invention is applicable to any wafer; no matter whether its size is 8 inches, 12 inches or 4 inches.

While the invention has been described by way of example and in terms of preferred embodiment, the invention is not limited thereto. To the contrary, it is intended to cover various modifications, procedures and products, and the scope of the appended claims therefore should be accorded to the broadest interpretation so as to encompass all such modifications and similar arrangement, procedures and products.

What is claimed is:

1. A robot calibration tool, wherein said tool is a circular transparent plate, wherein an edge of said robot calibration tool comprises a guide groove, and wherein at least one symbolize line is located on said robot calibration tool.

2. The tool according to claim 1, wherein a size of said robot calibration too is approximately is equal to a size of a wafer for semiconductor fabrication.

3. The tool according to claim 1, wherein a thickness of said robot calibration too is thick enough to prevent bending of the calibration tool.

4. The tool according to claim 1, wherein a material of said robot calibration tool comprises an elastic material and plastic.

5. The tool according to claim 1, wherein said symbolize line comprises crisscross markings.

6. A robot calibration method, wherein said method comprises the steps of:

providing a circular transparent plate, where a size of said circular transparent plate is equal to a size of a wafer for semiconductor fabrication;

placing said circular transparent plate over a calibration position;

moving a robot to an optimized position by adjusting parameters of said robot;

saving a plurality of results of said parameters; and executing a dry transform test, wherein said optimized position is a relative position between said robot and said circular transparent plate situated in a predetermined working range of said robot.

7. The method according to claim 6, wherein said circular transparent plate comprises a plurality of symbolize lines, said symbolize lines locate being located on a top surface of said circular transparent plate.

8. The method according to claim 6, wherein said calibration position comprises a storage pick/drop position and a cassette pick/drop position.

9. The method according to claim 8, wherein said parameters comprise parameters related to a moving step, a rotating angle and a moving distance of said robot.

* * * * *